United States Patent [19]

Kanbara

[11] Patent Number: 5,036,231
[45] Date of Patent: Jul. 30, 1991

[54] SENSE AMPLIFIER CIRCUIT USING THEN FILM TRANSISTORS

[75] Inventor: Minoru Kanbara, Tokyo, Japan

[73] Assignee: Casio Computer Co., Ltd., Tokyo, Japan

[21] Appl. No.: 517,352

[22] Filed: May 1, 1990

[30] Foreign Application Priority Data

May 15, 1989 [JP] Japan ................. 1-120749

[51] Int. Cl.$^5$ ............................................. H03K 5/22
[52] U.S. Cl. .................................. 307/530; 307/350; 365/205
[58] Field of Search .......................... 307/350, 530; 365/189.05, 205

[56] References Cited

U.S. PATENT DOCUMENTS

| 3,445,780 | 5/1969 | Beelitz | 330/69 |
| 3,614,645 | 10/1971 | Wheatley, Jr. | 330/255 |
| 4,158,241 | 6/1979 | Takemge et al. | 365/205 |
| 4,368,529 | 1/1983 | Furuyama | 365/205 |
| 4,430,648 | 2/1984 | Togashi et al. | 340/718 |
| 4,461,965 | 7/1984 | Chin | 365/205 |
| 4,551,641 | 11/1985 | Pelley | 365/205 |
| 4,715,015 | 12/1987 | Mimoto et al. | 365/205 |
| 4,866,673 | 9/1989 | Higuchi et al. | 365/205 |
| 4,932,002 | 6/1990 | Houston | 365/205 |

Primary Examiner—Stanley D. Miller
Assistant Examiner—Terry D. Cunningham
Attorney, Agent, or Firm—Frishauf, Holtz, Goodman & Woodward

[57] ABSTRACT

A sense amplifier circuit includes an amplifier including first and second inverter circuits which each have a pair of thin film transistors and are connected in a cross-coupled configuration, a precharging thin film transistor connected between the first and second inverter circuits, input transfer gates respectively connected between the first and second inverter circuits and first and second input terminals, and output transfer gate respectively connected between the first and second inverter circuits and first and second input terminals. With the above construction, the precharging thin film transistor is made active to precharge the amplifier and then the transfer gates are operated to permit an input signal to be input to the amplifier, thereby causing the input signal to be discriminated between two values and amplified.

1 Claim, 3 Drawing Sheets

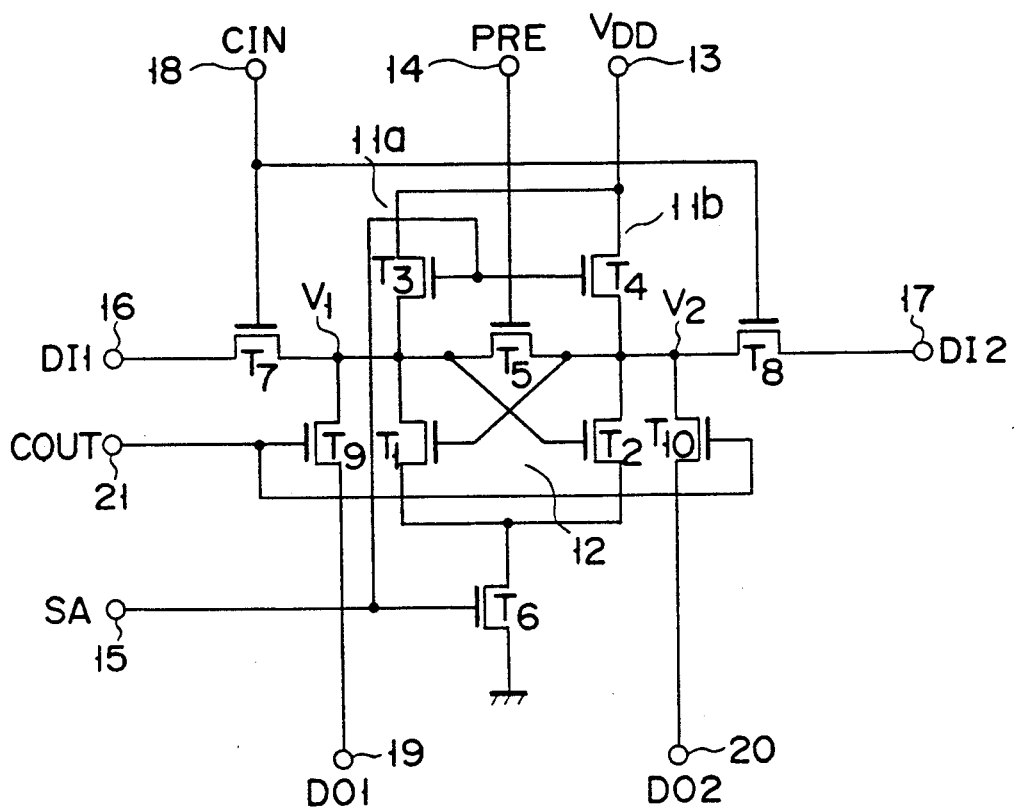
F I G. 1

SENSE AMPLIFIER CIRCUIT USING THEN FILM TRANSISTORS

BACKGROUND OF THE INVENTION

1. Field of the Invention

This invention relates to a sense amplifier circuit using thin film transistors.

2. Description of the Related Art

Recently, studies were conducted on thin film transistors which can be formed on an insulative substrate such as glass substrate. Such studies are disclosed in, for example U.S. Pat. Application Nos. 427,041, 427,252 and 467,736 which are filed by the same Applicant of this application. This type of memory can be used as an electrically erasable and programmable nonvolatile memory and has a feature that it can be easily manufactured in a large scale in comparison wit EEPROMs of floating gate type and MNOS type which are well known in the art.

When data is read out from the thin film transistor memory, it is necessary to amplify and discriminate a small analog signal by use of a sense amplifier circuit. However, in the prior art, a sense amplifier circuit formed of thin film transistors has been not realized. Therefore, when data is read out from the thin film transistor memory, it is necessary to use a sense amplifier circuit formed of bipolar transistors or MOS transistors. Since the conventional sense amplifier circuits cannot be formed on the glass substrate, it is required to use a high-level technique for connection between the thin film transistor memory formed on the glass substrate and the sense amplifier circuit.

SUMMARY OF THE INVENTION

An object of this invention is to provide a sense amplifier circuit which can be constructed by thin film transistors.

Another object of this invention is to provide a sense amplifier circuit which is constructed by thin film transistors and which is capable of discriminating an input signal with a specified voltage used as a threshold voltage and amplifying the input signal to a power source voltage.

In order to attain the above objects, a sense amplifier circuit is provided which uses thin film transistors and comprises an amplifier including first and second inverter circuits each having a pair of thin film transistors and means for connecting the first and second inverter circuits in a cross-coupled configuration; a precharging thin film transistor connected between the first and second inverter circuits; first and second input terminals; signal input transfer gates respectively connected between the first and second inverter circuits and the first and second input terminals; first and second output terminals; and signal output transfer gates respectively connected between the first and second inverter circuits and the first and second input terminals.

With the sense amplifier circuit having the above construction, the precharging thin film transistors are made active to precharge the amplifier and then the transfer gates are operated to permit an input signal to be input to the amplifier, thereby causing the input signal to be discriminated between two values and amplified.

Therefore, according to this invention, a small analog signal can be discriminated and amplified by the sense amplifier circuit using the thin film transistors. Further, the sense amplifier circuit can be formed integrally with a thin film transistor memory. In addition, the sense amplifier circuit can be used not only as a readout circuit for the memory but also as a readout circuit of a close-contact type line sensor or buffer circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 1 is a circuit diagram showing the construction of one embodiment of a sense amplifier circuit using thin film transistors according to this invention;

DETAILED DESCRIPTION OF THE PREFERRED EMBODIMENT

Figure 2:
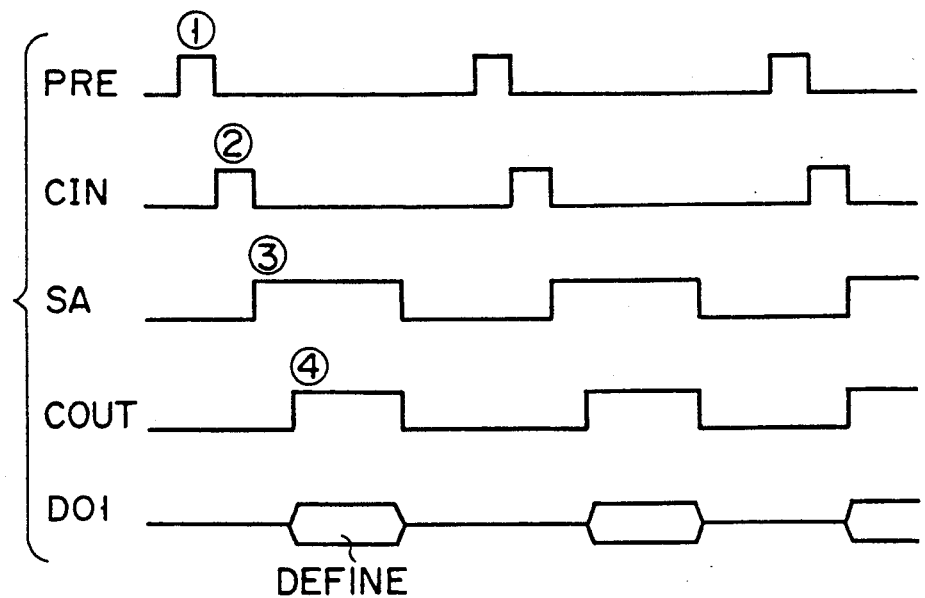
FIG. 2 is a timing chart for illustrating the operation of the sense amplifier circuit shown in FIG. 1.

There will now be described an embodiment of this invention with reference to the accompanying drawings.

FIG. 1 is a circuit diagram showing the construction of a sense amplifier circuit using thin film transistors according to this invention. As shown in FIG. 1, an amplifier 12 is constituted by connecting an inverter circuit 11a formed of thin film transistors T1 and T3 to an inverter 11b formed of thin film transistors T2 and T4 in a cross-coupled configuration. A control thin film transistor T5 is connected between the intermediate node of the inverters 11a and 11b, that is, between the drain electrodes of the thin film transistors T1 and T3 and the drain electrodes of the thin film transistors T2 and T4. A control thin film transistor T6 is connected between the ground terminal and the source electrodes of the thin film transistors T1 and T2. A VDD power source voltage is applied to the source electrodes of the thin film transistors T3 and T4 via a terminal 13 and a precharging signal PRE is supplied to the gate electrode of the thin film transistor T5 via a terminal 14. Further, an operation timing signal SA is supplied to the gate electrodes of the thin film transistors T3, T4 and T6 via a terminal 15.

A signal DI1 input to a terminal 16 is supplied to the drain electrodes of the thin film transistors T1 and T3 via a thin film transistor T7, and a signal DI2 input to a terminal 17 is supplied to the drain electrodes of the thin film transistors T2 and T4 via a thin film transistor T8. A signal readout clock pulse CIN is supplied to the gate electrodes of the thin film transistors T7 and T8 via a terminal 18.

An output signal DO1 is derived from the drain electrodes of the thin film transistors T1 and T3 via a thin film transistor T9 and a terminal 19, and an output signal DO2 is derived from the drain electrodes of the thin film transistors T2 and T4 via a thin film transistor T10 and a terminal 20. A signal output clock pulse COUT is supplied from a terminal 21 to the gate electrodes of the thin film transistors T9 and T10.

Figure 3A:
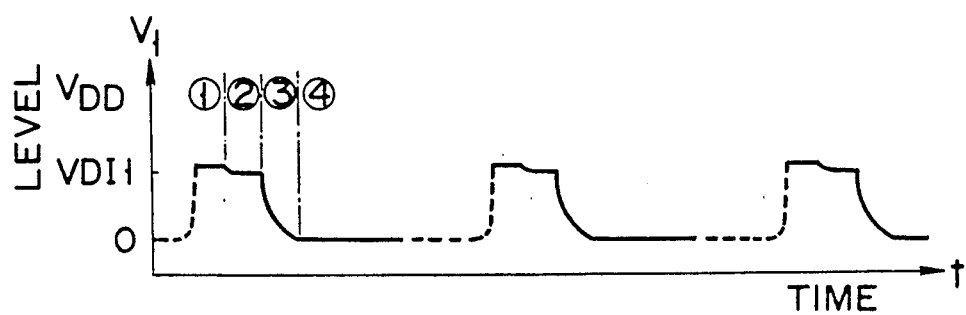
FIGS. 3A and 3B are signal waveform diagrams for illustrating the operation of the sense amplifier circuit shown in FIG. 1.
Figure 3B:
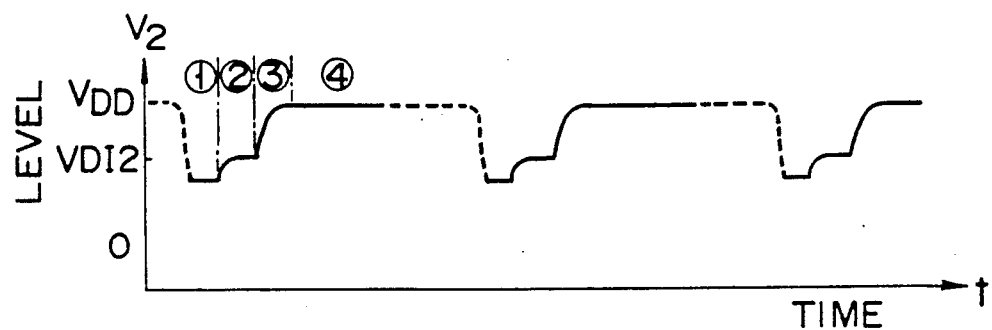

Next the operation of the above embodiment is explained with reference to the timing chart shown in FIG. 2 and the signal waveforms shown in FIGS. 3A and 3B. In FIG. 2, the generation timings of various timing signals PRE, CIN, SA and COUT input to the terminals 14, 18, 15 and 21 in the circuit of FIG. 1 and the output timing of the signal DO1 output from the terminal 19 are shown, and the waveforms of signals on both ends of the thin film transistor T5 are shown in FIGS. 3A and 3B.

In order to operate the sense amplifier circuit shown in FIG. 1, the potentials of the pulse signals CIN, SA and COUT input to the terminals 18, 15 and 21 are first set to an "L" level (low level) as shown by ① in FIG. 2 and only the precharge signal PRE supplied to the terminal 14 is set to an "H" level (high level). When the precharge signal PRE is set to the "H" level, the thin film transistor T5 is turned on to precharge the inverters 11a and 11b. As a result, as shown in FIGS. 3A and 3B, the potentials V1 and V2 at the opposite ends of the thin film transistor T5 are set equal to each other (① in FIGS. 3A and 3B).

Next, the precharge signal PRE is set to the "L" level and only the clock pulse CIN input to the terminal 18 is set to the "H" level (② in FIG. 2). At this time, if the potentials of signals DI1 and DI2 supplied to the input terminals 16 and 17 are set to VDI1 and VDI2, respectively, then the potentials V1 and V2 of the opposite ends of the thin film transistor T5 are set to VDI1 and VDI2 (② in FIGS. 3A and 3B). In this case, one of the potentials is set higher than the other so as to set up the relation of VDI1<VDI2, for example.

After this, the clock pulse CIN is set to the "L" level, and the timing signal SA input to the terminal 15 is set to the "H" level (③ in FIG. 2). When the timing signal SA is set to the "H" level, the thin film transistors T3, T4 and T6 are turned on so as to set the amplifier 12 constituted by the thin film transistors T1, T3, T2 and T4 operative. Then, the amplifier 12 thus constructed amplifies V1 and V2 to set them to the "L" and "H" levels, respectively, (③ in FIGS. 3A and 3B).

After the amplification operation is stably effected by the amplifier 12, the clock pulse COUT input to the terminal 21 is set to the "H" level so as to derive output signals of the amplifier 12 to the exterior. That is, when the clock pulse COUT is set to the "H" level, the thin film transistors T9 and T10 are turned on so that the output signals of the amplifier 12 can be output to the exterior via the thin film transistors T9 and T10 and the terminals 19 and 20, respectively.

In the above embodiment, the signals VDI1 and VDI2 input to the terminals 16 and 17 are set to set up the relation of "VDI1<VDI2". However, it is also possible to set up the relation of "VDI1>VDI2", and in this case, the signal levels of the signals DO1 and DO2 output from the terminals 19 and 20 are inverted with respect to those obtained in the case shown in FIGS. 3A and 3B.

Further, if the signal VDI1 input to the terminal 16 is set to a constant voltage and is used as the reference voltage and the analog signal VDI2 is input from the terminal 17, then the circuit shown in FIG. 1 can be operated as a 2-level discriminator amplifier.

Figure 4:
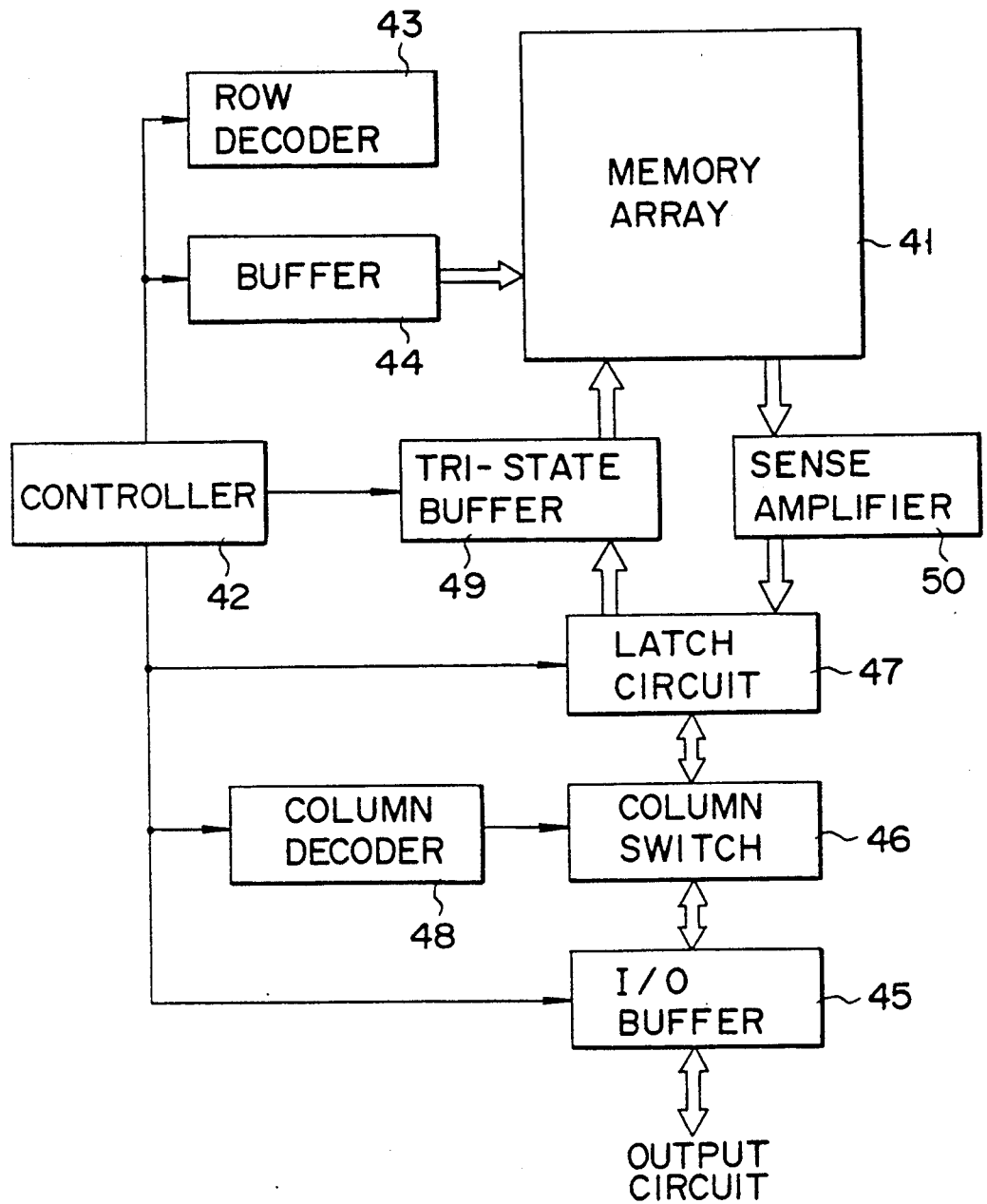
FIG. 4 is a block diagram of a memory circuit to which this invention is applied.

Next, a case in which the sense amplifier circuit of this invention is used is explained with reference to FIG. 4. In FIG. 4, 41 denotes a memory array having 32×32 thin film transistor memory cells, for example, and in this case, thin film transistor memories having the structure described in the afore-mentioned U.S. Pat. Application Nos. 427,041, 42,725 and 467,736 can be used. The write-in/readout/erasing mode and the address of the memory array 41 can be specified by a controller 42.

A 5-bit address code output from the controller 42 is decoded into 32-bit address data by a row decoder 43 and set into a buffer 44 of 32-stage construction. An output of the buffer 44 is used as a row address of the memory array 41.

The column address of the memory array 41 is so constructed as to designate 32 columns at the same time. Write-in data input via an I/O buffer 45 from an external device (not shown) is set into a latch circuit 47 of 32-stage construction via a column switch 46 by setting eight bits at one time in four respective data setting operations. That is, a 2-bit column designating code is output from the controller 42 and is converted into 4-bit column designation data by means of a column decoder 48. The column switch 46 is used to select those columns of the latch circuit 47 with 32-stage construction of 8 bits×4 columns into which 8-bit data output from the I/O buffer 45 should be written according to the 4-bit column data. The write-in data written into the latch circuit 47 is written into the memory array 41 via a tri-state buffer 49 for controlling the opening/closing state of the gate. On the other hand, readout data from the memory array 41 is read out by means of a sense amplifier circuit 50. The circuit 50 is constructed by a sense amplifier circuits including thin film transistors according to this invention, and includes a plurality of sense amplifiers corresponding in number to the output data lines of the memory array 41, that is, 32 sense amplifier circuits. Data detected by the sense amplifier circuit 50 is set into the latch circuit 47, and output to the exterior via the column switch 46 and I/0 buffer 45 by outputting eight bits at one time in four respective data outputting operations. The write-in, readout and erasing operations are described in detail in the afore-mentioned U.S. Patent Applications.

In the circuit of FIG. 4, circuits other than the sense amplifier circuit 50 can also be formed of thin film transistors and formed integrally with the sense amplifier circuit on the glass substrate.

Additional advantages and modifications will readily occur to those skilled in the art. Therefore, the invention in its broader aspects is not limited to the specific details, representative devices shown and described herein. Accordingly, various modifications may by without departing from the spirit or scope of the general inventive concept as defined by the appended claims and their equivalents.

What is claimed is:

1. A sense amplifier circuit using thin film transistors, comprising:
    an amplifier including first and second inverter circuits each having a pair of thin film transistors and means for connecting said first and second inverter circuits in a cross-coupled configuration;

a precharging thin film transistor connected between said first and second inverter circuits;

first and second input terminals;

first and second signal input transfer gates respectively connected between said first and second inverter circuits and said first and second input terminals;

first and second output terminals; and first and second signal output transfer gates respectively connected between said first and second inverter circuits and said first and second output terminals.

* * * * *

UNITED STATES PATENT AND TRADEMARK OFFICE
CERTIFICATE OF CORRECTION

PATENT NO. : 5,036,231
DATED : July 30, 1991
INVENTOR(S) : M. KANBARA

It is certified that error appears in the above-identified patent and that said Letters Patent is hereby corrected as shown below:

TITLE PAGE:

The title of the patent should read:

--SENSE AMPLIFIER CIRCUIT USING THIN FILM TRANSISTORS--

Section [56] References Cited, the name of the inventor of USP 4,158,241 should read --Takemae et al--.

Abstract, line 8, "gate" should read --gates--.

Signed and Sealed this

Sixteenth Day of March, 1993

Attest:

STEPHEN G. KUNIN

Attesting Officer     Acting Commissioner of Patents and Trademarks